(12) United States Patent
Miura (10) Patent No.: US 9,852,974 B2
(45) Date of Patent: Dec. 26, 2017

(54) SUBSTRATE, LIGHT-EMITTING DEVICE WITH SUBSTRATE, METHOD OF MANUFACTURING SUBSTRATE ASSEMBLY AND METHOD OF MANUFACTURING LIGHT-EMITTING DEVICE WITH SUBSTRATE

(71) Applicants: CITIZEN ELECTRONICS CO., LTD., Yamanashi-ken (JP); CITIZEN WATCH CO., LTD., Tokyo (JP)

(72) Inventor: Yuichi Miura, Yamanashi-ken (JP)

(73) Assignees: CITIZEN ELECTRONICS CO., LTD., Yamanashi-Ken (JP); CITIZENS WATCH CO., LTD., Tokyo (JP)

(*) Notice: Subject to any disclaimer, the term of this patent is extended or adjusted under 35 U.S.C. 154(b) by 0 days.

(21) Appl. No.: 15/198,637

(22) Filed: Jun. 30, 2016

(65) Prior Publication Data

US 2017/0005033 A1 Jan. 5, 2017

Related U.S. Application Data

(60) Provisional application No. 62/188,547, filed on Jul. 3, 2015.

(51) Int. Cl.
*H01L 23/498* (2006.01)
*H01L 33/62* (2010.01)
*H01L 21/48* (2006.01)

(52) U.S. Cl.
CPC .... *H01L 23/49838* (2013.01); *H01L 21/4857* (2013.01); *H01L 23/49822* (2013.01);
(Continued)

(58) Field of Classification Search
CPC ......... H01L 23/49822; H01L 23/49838; H01L 33/62; H01L 21/4857; H01L 2933/0066; H01L 2224/48091; H01L 2924/00014
See application file for complete search history.

(56) References Cited

U.S. PATENT DOCUMENTS

2005/0087747 A1* 4/2005 Yamada ................... G02B 6/43
257/80
2007/0000688 A1* 1/2007 Mobley ............... H01L 21/4857
174/255

(Continued)

FOREIGN PATENT DOCUMENTS

JP 08-222855 8/1996
JP 2011-086663 4/2011

*Primary Examiner* — Caridad Everhart
(74) *Attorney, Agent, or Firm* — Wenderoth, Lind & Ponack, L.L.P.

(57) ABSTRACT

A substrate includes a first electrode layer including a first electrode and a second electrode; a second electrode layer including a first electrode and a second electrode; a third electrode layer including a first electrode and a second electrode; and a resin layer. The first electrode layer is arranged on a first side of the resin layer, the third electrode layer is arranged on a second side of the resin layer opposed to the first side, the second electrode layer is positioned in the resin layer, and the first electrode layer is thicker than the second electrode layer. The first and second electrodes of the first electrode layer are positioned inside a peripheral edge of the first side of the resin layer, and the first and second electrodes of the third electrode layer are positioned inside a peripheral edge of the second side of the resin layer.

17 Claims, 8 Drawing Sheets

(52) U.S. Cl.
CPC .... *H01L 33/62* (2013.01); *H01L 2224/48091* (2013.01); *H01L 2933/0066* (2013.01)

(56) References Cited

U.S. PATENT DOCUMENTS

| | | | | |
|---|---|---|---|---|
| 2007/0057363 | A1* | 3/2007 | Nakamura | H01L 23/49822 257/698 |
| 2010/0000678 | A1* | 1/2010 | Jo | H05K 3/025 156/324 |
| 2014/0301054 | A1* | 10/2014 | Nagai | H01L 33/62 361/761 |

* cited by examiner

SUBSTRATE, LIGHT-EMITTING DEVICE WITH SUBSTRATE, METHOD OF MANUFACTURING SUBSTRATE ASSEMBLY AND METHOD OF MANUFACTURING LIGHT-EMITTING DEVICE WITH SUBSTRATE

CROSS-REFERENCE TO RELATED APPLICATION

This application is a new U.S. patent application that claims benefit of U.S. provisional application No. 62/188,547 filed on Jul. 3, 2015, the disclosures of which are incorporated herein by reference in its entirety.

BACKGROUND OF THE INVENTION

Field of the Invention

The present invention relates to a substrate. The present invention also relates to a light-emitting device including a substrate and a light-emitting element mounted on the substrate. The present invention further relates to a method manufacturing a substrate assembly, and relates to a method manufacturing a light-emitting device including a substrate and a light-emitting element.

Description of the Related Art

A conventional light-emitting device including a multi-layered printed circuit board, in which printed wiring boards are layered and an outermost hard layer of the printed wiring boards includes a heatsink, is open to the public (For reference, see Japanese published unexamined application No. H08-222855).

Also, a conventional multi-layered substrate including a heat releasing structure for an LED element is open to the public (For reference, see Japanese published unexamined application No. 2011-086663).

SUMMARY OF THE INVENTION

In a first aspect of the present inventive subject matter, a substrate includes a first electrode layer that includes a first electrode and a second electrode; a second electrode layer that includes a first electrode and a second electrode; a third electrode layer including a first electrode and a second electrode; and a resin layer, the first electrode layer is arranged on a first side of the resin layer, the third electrode layer is arranged on a second side that is an opposite side of the first side of the resin layer, the second electrode layer is positioned in the resin layer, the first electrode layer is greater in thickness than the second electrode layer, the first electrode and the second electrode of the first electrode layer are positioned inside a peripheral edge of the first side of the resin layer, and the first electrode and the second electrode of the third electrode layer are positioned inside a peripheral edge of the second side of the resin layer.

Also, it is suggested that the first electrode layer is one and half times as thick as the second electrode layer or greater in thickness.

Furthermore, it is disclosed that the first electrode of the second electrode layer in the resin layer includes a first connecting portion that extends from the first electrode of the second electrode layer toward a peripheral side of the resin layer, and the second electrode of the second electrode layer in the resin layer includes a second connecting portion that extends from the second electrode of the second electrode layer toward the peripheral side of the resin layer.

Also, it is disclosed that the first electrode of the first electrode layer, the first electrode of the second electrode layer, and the first electrode of the third electrode layer are electrically connected to one another through filled vias.

Furthermore, it is disclosed that the second electrode of the first electrode layer, the second electrode of the second electrode layer, and the second electrode of the third electrode layer are electrically connected to one another through filled vias.

Also, it is disclosed that the number of the filled vias that electrically connect the first electrode of the first electrode layer and the first electrode of the second electrode layer is greater than the number of filled vias that electrically connect the second electrode of the first electrode layer and the second electrode of the second electrode layer.

In a second aspect of the present inventive subject matter, a light-emitting device includes a substrate; and a light-emitting element mounted on the substrate, the substrate includes a first electrode layer including a first electrode and a second electrode, a second electrode layer that includes a first electrode and a second electrode, a third electrode layer including a first electrode and a second electrode, and a resin layer, the first electrode layer is arranged on a first side of the resin layer, the third electrode layer is arranged on a second side that is an opposite side of the first side of the resin layer, the second electrode layer is positioned in the resin layer, the first electrode layer is greater in thickness than the second electrode layer, the light-emitting element is mounted on the first electrode of the first electrode layer, and the light-emitting element is electrically connected to the first electrode and the second electrode of the first electrode layer, the first electrode and the second electrode of the first electrode layer are positioned inside a peripheral edge of the first side of the resin layer, and the first electrode and the second electrode of the third electrode layer is positioned inside a peripheral edge of the second side of the resin layer.

In a third aspect of the present inventive subject matter, a method manufacturing a substrate assembly includes: preparing a first electrode layer assembly that includes pairs of electrodes, each pair of which includes a first electrode and a second electrode that is smaller in area than the first electrode on a first side of a resin layer; preparing a second electrode layer assembly that is thinner than the first electrode layer assembly, the second electrode layer assembly includes pairs of electrodes, each pair of which includes a first electrode and a second electrode that is smaller in area than the first electrode and a first connecting portion that electrically connects first electrodes of the pairs of the second electrode layer assembly and a second connecting portion that electrically connects second electrodes of the second electrode layer assembly on a second side of the resin layer; arranging an additional resin in a state of liquid to form the resin layer covering the second electrode layer assembly such that the pairs of the electrodes of the second electrode layer assembly are buried in the resin layer; and arranging a metallic layer on a second side of the resin layer in which the pairs of the electrodes of the second electrode layer assembly is buried, the second side being an opposite side of the first side of the resin layer to form a third electrode layer assembly of the substrate assembly; forming filled vias to be arranged through the first electrode layer in the resin layer to electrically connect the first electrode layer assembly and the second electrode layer assembly; forming filled vias to be arranged through the third electrode layer assembly in the resin layer to electrically connect the third electrode layer assembly and the second electrode layer assembly; forming an electroplated coating on the first electrode layer assembly and the filled vias that are arranged through the first electrode layer assembly; and forming an electroplated coating on the third electrode layer assembly and the filled vias that are arranged through the third electrode layer.

Also, it is disclosed that the electroplated coating is formed on the first electrode layer assembly and the filled vias that electrically connect the first electrode layer assembly and the second electrode layer assembly by applying current to the second electrode layer assembly. Furthermore, it is disclosed that the electroplated coating is formed on the third electrode layer assembly and the filled vias that electrically connect the third electrode layer assembly and the second electrode layer assembly by applying current to the second electrode layer assembly.

In a fourth aspect of the present inventive subject matter, it is disclosed that a method manufacturing a light-emitting device with a substrate includes manufacturing the substrate assembly. The method of manufacturing a light-emitting device with a substrate further includes electrically mounting light-emitting elements on the first electrode layer assembly that includes the pairs of the first electrode and the second electrode of the substrate assembly; sealing the light-emitting elements by a light-transmitting resin layer on the substrate assembly; and dicing the substrate assembly with the light-emitting elements mounted and sealed by the light-transmitting layer on the substrate assembly into light-emitting devices each with a substrate that includes the first electrode and the second electrode of the first electrode layer, the first electrode and the second electrode of the second electrode layer, and the first electrode and the second electrode of the third electrode layer and the light-transmitting layer.

BRIEF DESCRIPTION OF THE DRAWINGS

FIGS. 5A to 5E relate to a method of manufacturing a light-emitting device including a substrate according to an embodiment of the subject invention.

DETAILED DESCRIPTION OF THE EMBODIMENTS

As used herein, the term "and/or" includes any and all combinations of one or more of the associated listed items.

The terminology used herein is for the purpose of describing particular embodiments only and is not intended to be limiting of the subject matter. As used herein, the singular forms "a", "an" and "the" are intended to include the plural forms as well, unless the context clearly indicates otherwise.

As illustrated in the figures submitted herewith, some sizes of structures or portions may be exaggerated relative to other structures or portions for illustrative purposes. Relative terms such as "below" or "above" or "upper" or "lower" or "front" or "rear" or "side" may be used herein to describe a relationship of one element, portion, or area to another element, portion or area as illustrated in the figures. It will be understood that these terms are intended to encompass different orientations of a device and/or an appliance in addition to the orientation depicted in the figures.

Embodiments of the invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Embodiments of the invention are described with reference to drawings included herewith. Same and/or similar reference numbers refer to same and/or similar and/or corresponding and/or related structures throughout. It should be noted that the drawings are schematic in nature.

Figure 1A:
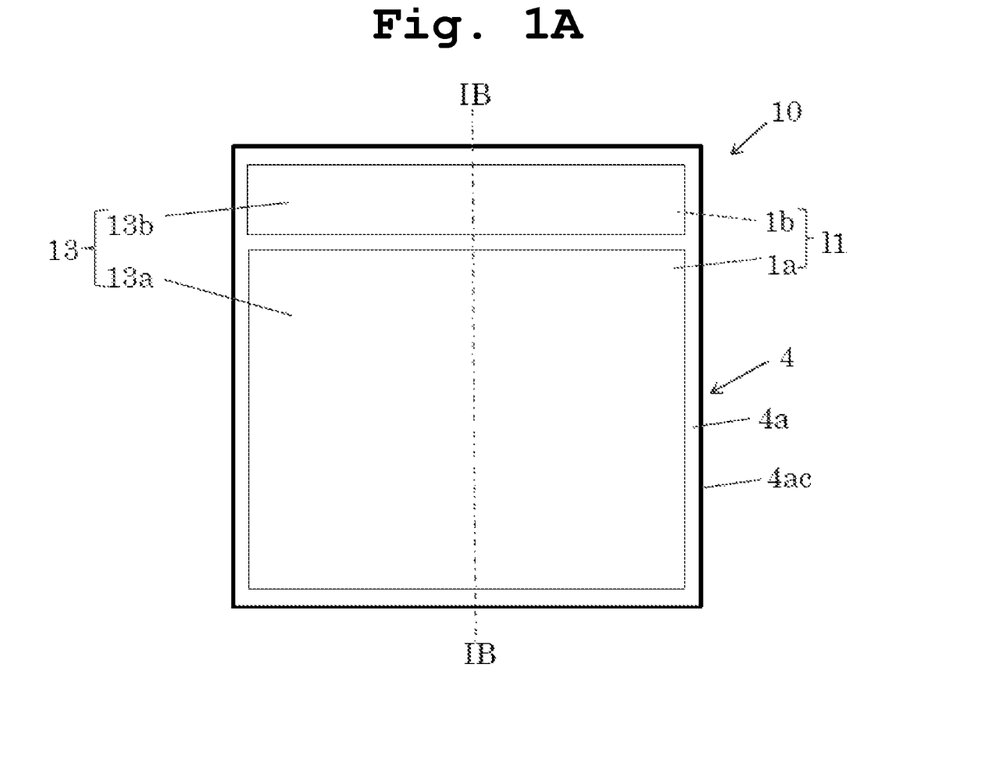
FIG. 1A shows a plan view of a first embodiment of a substrate according to the present invention.
Figure 1B:
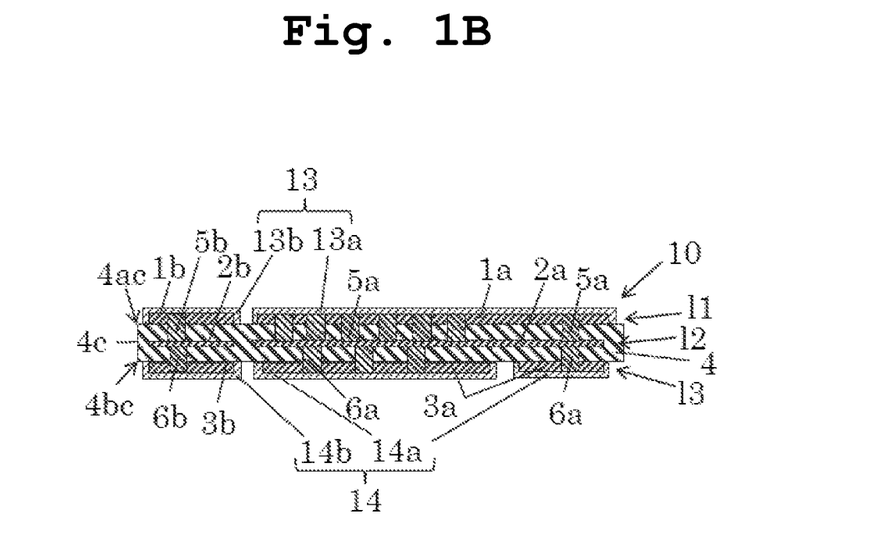
FIG. 1B shows a cross-sectional view of a substrate, taken along a dotted and dashed line IB-IB shown in FIG. 1.

FIG. 1A shows a plan view of a first embodiment of a substrate according to the present invention. FIG. 1A shows a first electrode layer 11 on a first side 4a of a resin layer 4. FIG. 1B shows a cross-sectional view of a substrate, taken along a dotted and dashed line IB-IB shown in FIG. 1.

A substrate 10 includes a first electrode layer 11 that includes a first electrode 1a and a second electrode 1b; a second electrode layer 12 that includes a first electrode 2a and a second electrode 2b; a third electrode layer 13 that includes a first electrode 3a and a second electrode 3b; and a resin layer 4. The resin layer 4 may include a white-colored resin. The first electrode layer 11 is arranged on a first side 4a of the resin layer 4. The third electrode layer 13 is arranged on a second side 4b that is an opposite side of the first side 4a of the resin layer 4. The second electrode layer 12 is positioned in the resin layer 4. The first electrode layer 11 is greater in thickness than the second electrode layer 12.

There is a demand to efficiently release heat, which will be generated from the light-emitting element 7, while the light-emitting element 7 is activated to emit light by electric current. If an electrode of the substrate to which an electronic part such as a light-emitting element 7 is thermally connected has a greater volume, the substrate 10 is expected to have a better heat-releasing effect from the light-emitting element 7.

Figure 1C:
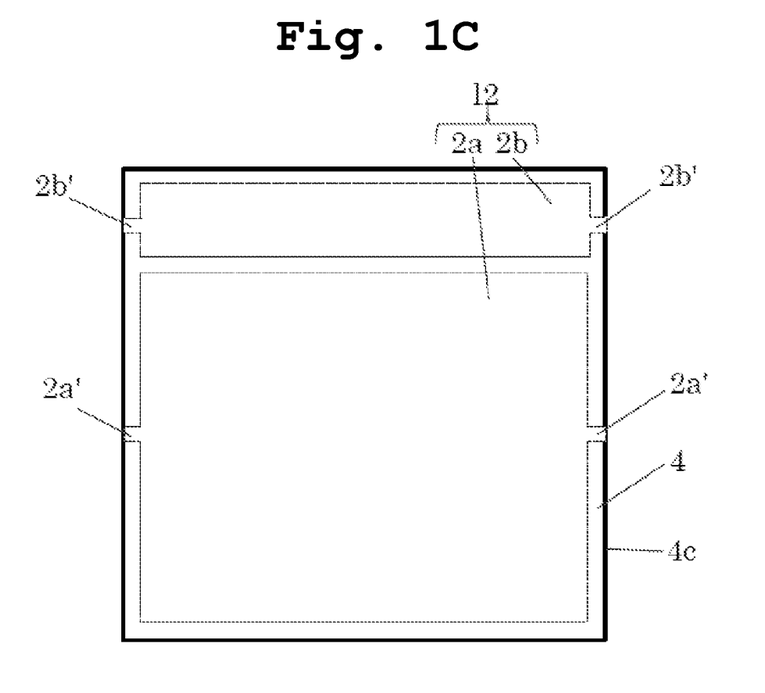
FIG. 1C shows a second electrode layer of a substrate according to the first embodiment of the substrate. The second electrode layer is positioned in the resin layer of the substrate shown in FIG. 1B.
Figure 1D:
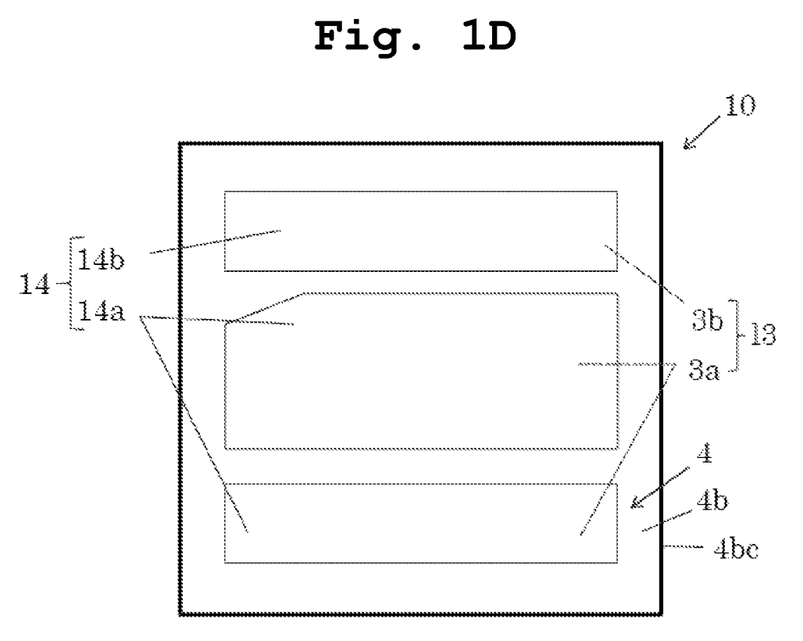
FIG. 1D shows a second side of the resin layer, showing a third electrode layer on the second side of the resin layer.

As shown in FIG. 1A, the first electrode 1a and the second electrode 1b of the first electrode layer 11 are positioned inside a peripheral edge 4ac of the first side 4a of the resin layer 4. As shown in FIG. 1D, the first electrode 3a and the second electrode 3b of the third electrode layer 13 are positioned inside a peripheral edge 4bc of the second side 4b of the resin layer 4.

The first electrode 1a and the second electrode 1b of the first electrode layer 11 are arranged on the first side 4a of the resin layer 4 with a space between the first electrode 1a and the second electrode 1b of the first electrode layer 11.

Similarly, the first electrode 1a and the second electrode 1b of the second electrode layer 12 are arranged in the resin layer 4 with a space between the first electrode 2a and the second electrode 2b of the second electrode layer 12. The first electrode 3a and the second electrode 3b of the third electrode layer 13 are arranged on the second side 4b of the resin layer 4 with a space between the first electrode 3a and the second electrode 3b of the third electrode layer 13.

Accordingly, the first electrode and the second electrode of the electrode layer, which includes the first electrode layer 11 the second electrode layer 12 and the third electrode layer 13, are electrically insulated from each other.

The first electrode layer 11 of the substrate 10 is one and half times as thick as the second electrode layer 12 or greater in thickness.

The third electrode layer 13 of the substrate 10 may be greater in thickness than the second electrode layer 12.

The third electrode layer 13 of the substrate 10 is one and half times as thick as the second electrode layer 12 or greater in thickness.

If an electrode layer which a light-emitting element is to be mounted on and thermally connected to is thicker than another electrode layer on which the light-emitting element is mounted, heat generated from the light-emitting element, while the light-emitting element is activated to emit light, will be efficiently transmitted from the light-emitting element to the electrode layer on which the light-emitting element 7 is mounted.

The first electrode 1a of the first electrode layer 11 has a surface area which is three times as large as the second electrode 1b of the first electrode layer 1 or larger surface area than the second electrode 1b of the first electrode layer 1.

If an electrode layer on which a light-emitting element is to be mounted is larger in surface area than another electrode layer, heat generated from the light-emitting element while the light-emitting element is activated to emit light will be efficiently transmitted from the light-emitting element to the electrode layer on which the light-emitting element 7 is mounted.

FIG. 1C shows a second electrode layer 12 of a substrate according to the first embodiment of the substrate. The second electrode layer 12 is positioned in the resin layer 4, as shown in FIG. 1B.

The first electrode 2a of the second electrode layer 12 in the resin layer 4 includes a first connecting portion 2a'. The first connecting portion 2a' extends from the first electrode 2a of the second electrode layer 12 toward a peripheral side 4c of the resin layer 4.

The second electrode 2b of the second electrode layer 12 in the resin layer 4 includes a second connecting portion 2b'. The second connecting portion 2b' extends from the second electrode 2b of the second electrode layer 12 toward the peripheral side 4c of the resin layer 4.

FIG. 1D shows a second side 4b of the resin layer 4. FIG. 1D shows a third electrode layer 13 on the second side 4b of the resin layer 4. The first electrode 3a of the third electrode layer 13 is shown as two separated portions in FIG. 1D, however, of course, it is possible to arrange the two separated portions of the first electrode 3a of the third electrode layer 13 to be a first electrode 3a that is integrated to be one.

Figure 2A:
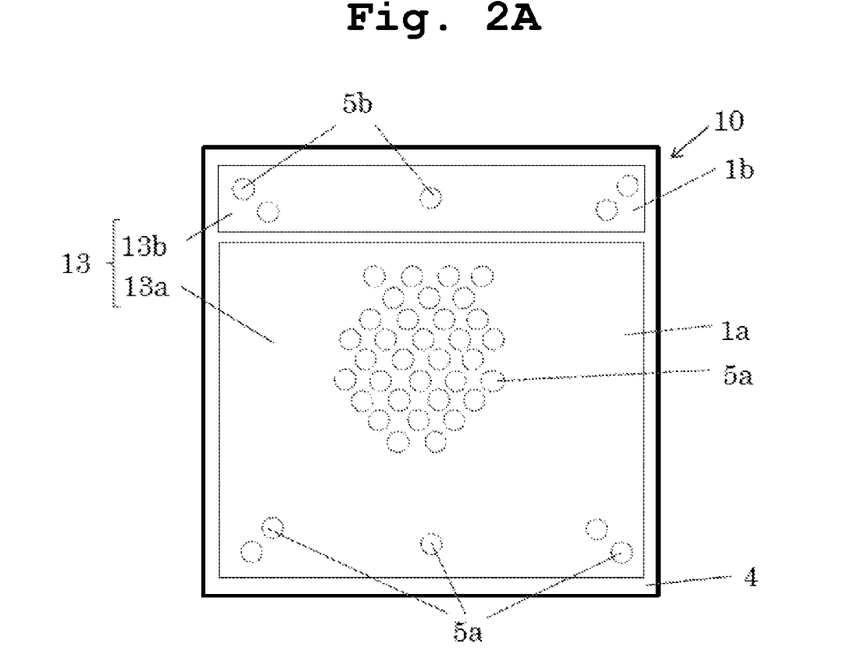
FIG. 2A shows an arrangement example of filled vias electrically connecting the first electrode layer on the first side of the resin layer and the second electrode layer in the resin layer.

FIG. 2A shows an arrangement example of filled vias 5a, 5b electrically connecting the first electrode layer 11 on the first side 4a of the resin layer 4 and the second electrode layer 12 that is positioned in the resin layer 4. For more details, filled vias 5a electrically connect the first electrode 1a of the first electrode layer 11 and the first electrode 2a of the second electrode layer 12. Filled vias 5b electrically connect the second electrode 1b of the first electrode layer 11 and the second electrode 2b of the second electrode layer 12.

Figure 2B:
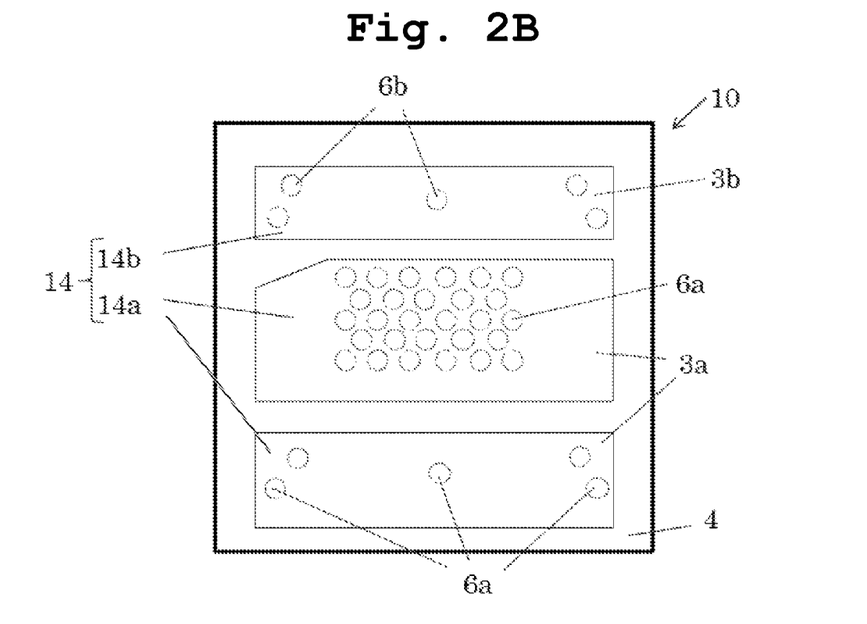
FIG. 2B shows an arrangement example of filled vias electrically connecting the second electrode layer in the resin layer and the third electrode layer on the second side of the resin layer.

FIG. 2B shows an arrangement example of filled vias 6a, 6b electrically connecting the second electrode layer 12 that is positioned in the resin layer 4 and the third electrode layer 13 on the second side 4b of the resin layer 4. For more details, filled vias 6a electrically connecting the first electrode 3a of the third electrode layer 13 and the first electrode 2a of the second electrode layer 12. Filled vias 6b electrically connect the second electrode 3b of the third electrode layer 13 and the second electrode 2b of the second electrode layer 12.

The number of filled vias and arrangement shown in a Figure are just an example, and thus, never limited to those shown herein. If a diameter of a filled via increases, heat generated from the light-emitting element 7 will be efficiently transmitted through the filled via to another electrode layer. However, if the diameter of a filled via increases, a concave might be generated at a surface of filled via. Accordingly, filled vias are arranged in a cluster instead of one or a few filled vias each with a greater diameter being arranged under the light-emitting element 7. The plurality of filled vias that are positioned independent from one another may be formed by a laser. If the filled vias are arranged in a cluster under the light-emitting element 7, it is possible to efficiently release heat generated from the light-emitting element 7 to the outside of the substrate 10.

As shown in FIG. 1B, the first electrode 1a of the first electrode layer 11, the first electrode 2a of the second electrode layer 12, and the first electrode 3a of the third electrode layer 13 are electrically connected to one another through filled vias 5a, 6a. The second electrode 1b of the first electrode layer 11, the second electrode 2b of the second electrode layer 12, and the second electrode 3b of the third electrode layer 13 are electrically connected to one another through filled vias 5b, 6b.

The number of the filled vias 5a that electrically connect the first electrode 1a of the first electrode layer 11 and the first electrode 2a of the second electrode layer 12 is greater than the number of filled vias 5b that electrically connect the second electrode 1b of the first electrode layer 11 and the second electrode 2b of the second electrode layer 12.

As shown in FIGS. 1A and 1B, the substrate 10 further includes an electroplated coating 13 separately covering the first electrode 1a and the second electrode 1b of the first electrode layer 11. Also, the substrate 10 further includes an electroplated coating 14 separately covering the first electrode 3a and the second electrode 3b of the third electrode layer 13.

For more details, the electroplated coating 13a is positioned at the first side 4a of the resin layer 4 and covers the first electrode 1a of the first electrode layer 11 and filled vias 5a that are configured to electrically connect the first electrode 1a of the first electrode layer 11 and the first electrode 2a of the second electrode layer 12. The electroplated coating 13b is positioned at the first side 4a of the resin layer 4 and covers the second electrode 1b of the first electrode layer 11 and filled vias 5b that are configured to electrically connect the second electrode 1b of the first electrode layer 11 and the second electrode 2b of the second electrode layer 12.

The electroplated coating 14a is positioned at the second side 4b of the resin layer 4 and covers the first electrode 3a of the third electrode layer 13 and filled vias 6a that are configured to electrically connect the first electrode 3a of the third electrode layer 13 and the first electrode 2a of the second electrode layer 12. The electroplated coating 14b is positioned at the second side 4b of the resin layer 4 and covers the second electrode 3b of the third electrode layer 13 and filled vias 6b that are configured to electrically connect the second electrode 3b of the third electrode layer 13 and the second electrode 2b of the second electrode layer 12. An electroplated coating may be arranged on an electrode as a protection layer against corrosion of the electrode. Also, an electroplated coating may be more compatible with a metallic wire and/or bump than an electrode itself.

Figure 3A:
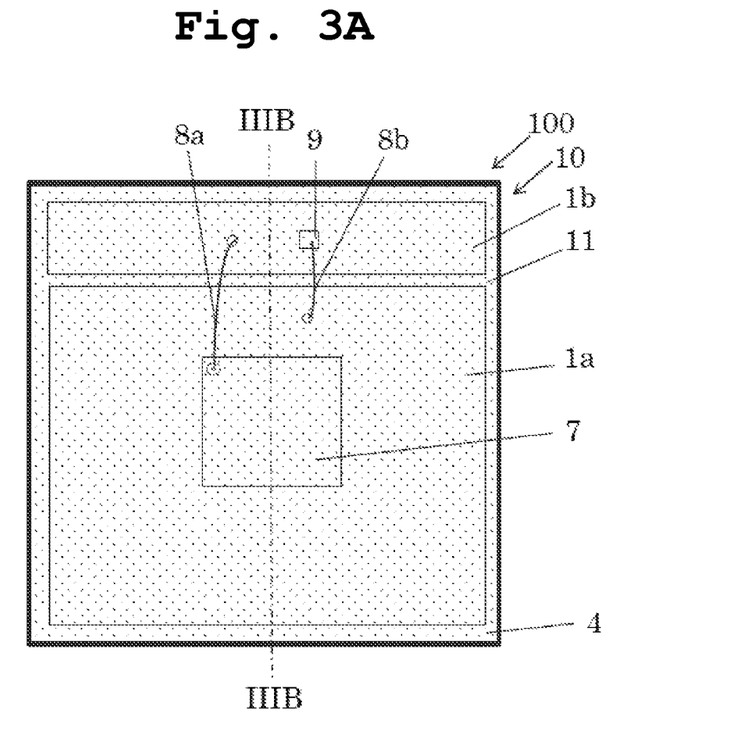
FIG. 3A shows a first embodiment of a light-emitting device according to the present invention.

FIG. 3A shows a first embodiment of a light-emitting device according to the present invention. The light-emitting device 100 includes a substrate 10 according to an embodiment of the substrate 10 of the present invention and a light-emitting element 7 mounted on a first electrode 1a of the first electrode layer 11. The light-emitting element 7 is electrically connected to the first electrode 1a and the second electrode 1b of the first electrode layer 11. The light-emitting device 100 may further include a light-transmitting resin 11 that seals the light-emitting element 7 on the substrate 10.

A protection element 9 may be mounted on the first electrode 1a or on the second electrode 1b of the first electrode layer 11. The protection element 9 is electrically connected in parallel to the light-emitting element 7 to protect the light-emitting element 7 from overcurrent damage. The protection element 9 may be electrically connected to the first electrode 1a and/or the second electrode 1b of the first electrode layer 11 by a metallic wire 8b. The protection element 9 may be electrically connected to the first electrode 1a and the second electrode 1b of the first electrode layer 11 by bumps.

Figure 3B:
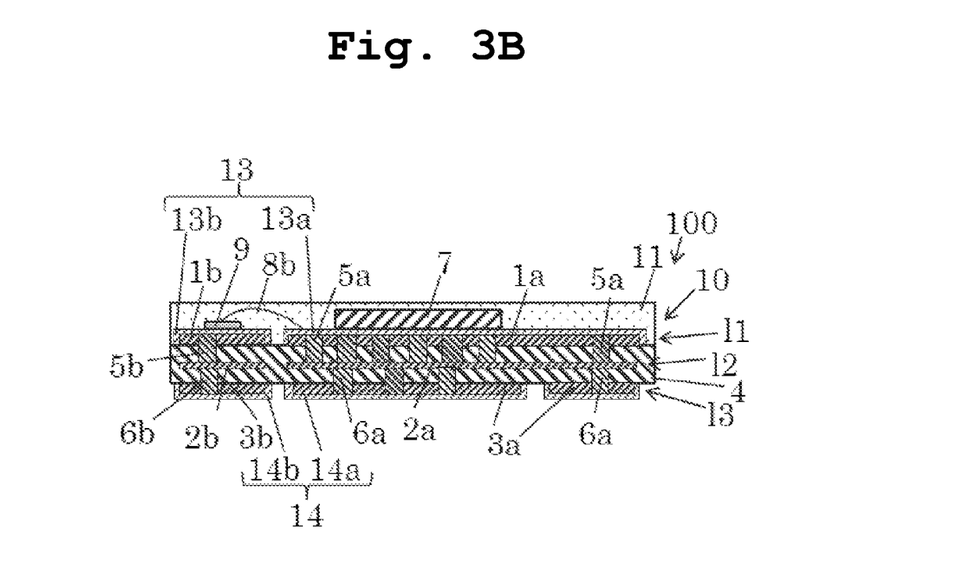
FIG. 3B shows a cross-sectional view of a light-emitting device, taken along a dotted and dashed line IIIB-IIIB shown in FIG. 3A.

FIG. 3B shows a cross-sectional view of a light-emitting device, taken along a dotted and dashed line IIIB-IIIB shown in FIG. 3A.

For more details, the light-emitting device 100 includes a substrate 10 and a light-emitting element 7 arranged on an electroplated coating 13a of the first electrode 1a of the first electrode layer 11.

The first electrode 1a of the first electrode layer 11 may be an anode electrode. The second electrode 1b of the first electrode layer 11 is a cathode electrode.

The light-emitting element 7 in this embodiment includes a first element electrode that is positioned at a lower side of the light-emitting element 7 and electrically and thermally connected to the first electrode 1a of the first electrode layer 11 through an electrically-conductive adhesive. Also, the light-emitting element 7 in this embodiment includes a second element electrode that is positioned at an upper side of the light-emitting element 7 and electrically connected to the second electrode 1b of the first electrode layer 11 by a metallic wire 8a. Also, it is of course possible to mount a light-emitting element 7 with a first element electrode and a second element electrode that are positioned on a lower surface of the light-emitting element 7 on the first electrode 1a and the second electrode 1b of the first electrode layer 11.

The light-emitting element 7 may be within a wavelength region of light from UV to visible light. The light-emitting element 7 may be a light-emitting element with a peak wavelength in a range of 300 nm to 600 nm. Also, the light-emitting element 7 may have a peak wavelength in a range of 800 nm to 1000 nm, for example. Furthermore, it is possible to arrange a phosphor in the light-transmitting resin 11 to obtain a required color of light. Also, it is possible to arrange a phosphor in the light-transmitting resin 11 to obtain a required color of light. Instead, a phosphor layer may be arranged above the light-emitting element 7.

For more details, a light-emitting device 100 includes a substrate 10 and a light-emitting element 7 mounted on the substrate 10. The substrate 10 includes a first electrode layer 11 that includes a first electrode 1a and a second electrode 1b, a second electrode layer 12 that includes a first electrode 2a and a second electrode 2b, and a third electrode layer 13 that includes a first electrode 3a and a second electrode 3b, and a resin layer 4 that includes a white-colored resin. The first electrode layer 11 is arranged on a first side 4a of the resin layer 4. The third electrode layer 13 is arranged on a second side 4b that is an opposite side of the first side 4a of the resin layer 4. The second electrode layer 12 is positioned in the resin layer 4. The first electrode layer 11 is greater in thickness than the second electrode layer 12. The light-emitting element 7 is mounted on the first electrode 1a of the first electrode layer 11. The light-emitting element 7 is electrically connected to the first electrode 1a and the second electrode 1b of the first electrode layer 11.

When viewed from above of the substrate 10, the first electrode 1a and the second electrode 1b of the first electrode layer 11 are positioned inside a peripheral edge 4ac of the first side 4a of the resin layer 4, as shown in FIG. 1A. When viewed from below of the substrate 10, The first electrode 3a and the second electrode 3b of the third electrode layer 13 are positioned inside a peripheral edge 4bc of the second side 4b of the resin layer 4, as shown in FIG. 1D of the substrate 10.

The first electrode 2a of the second electrode layer 12 in the resin layer 4 includes a first connecting portion 2a' that extends from the first electrode 2a of the second electrode layer 12 toward a peripheral side 4c of the resin layer 4.

The second electrode 2b of the second electrode layer 12 in the resin layer 4 includes a second connecting portion 2b' that extends from the second electrode 2b of the second electrode layer 12 toward the peripheral side 4c of the resin layer 4.

The first electrode 1a of the first electrode layer 11, the first electrode 2a of the second electrode layer 12, and the first electrode 3a of the third electrode layer 13 are electrically connected to one another through filled vias 5a, 6a. The second electrode 1b of the first electrode layer 11, the second electrode 2b of the second electrode layer 12, and the second electrode 3b of the third electrode layer 13 are electrically connected to one another through filled vias 5b, 6b.

Figure 4A:
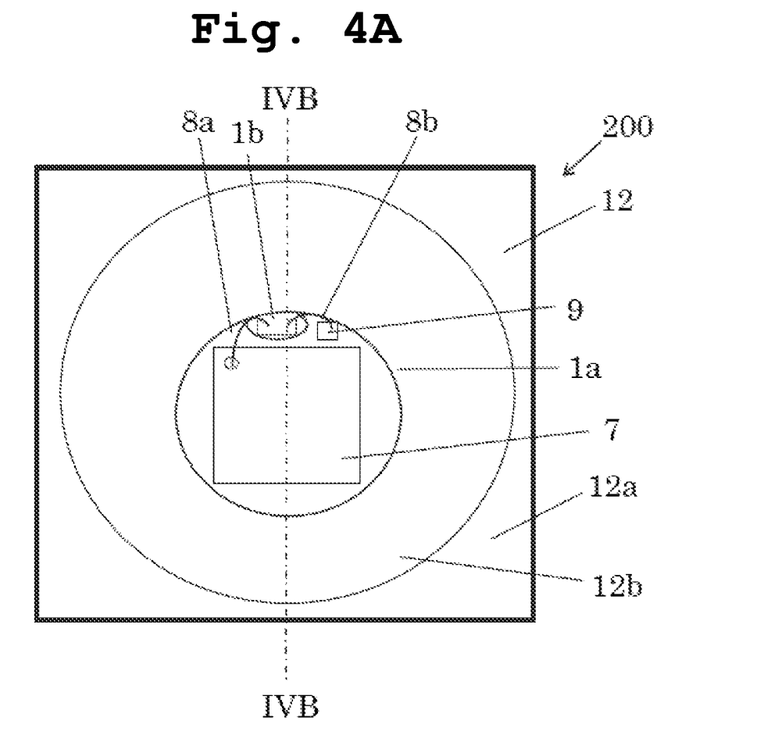
FIG. 4A shows a second embodiment of a light-emitting device according to the present invention.

FIG. 4A shows a second embodiment of a light-emitting device 200 according to the present invention. In this embodiment, the light-emitting device 200 further includes a reflector 12 which is arranged on the substrate 10 and surrounds the light-emitting element 7. A lens or a light-transmitting cover may be arranged on the reflector 12 to cover the light-emitting element 7. In this configuration, a light-transmitting resin 11 sealing the light-emitting element 7 in the first embodiment may be omitted, however, it is of course possible to arrange a light-transmitting resin 11 in the reflector 12 of the light-emitting device 200. The light-emitting element 7 may be arranged on a center axis of the reflector 12 which may have a parabolic surface inside the reflector. In another embodiment, the parabolic surface inside the reflector may be distorted to collect light from the light-emitting element 7 in a direction with an angle in a range of 2 to 10 degrees from the vertical direction to the upper surface of the light-emitting element 7.

Figure 4B:
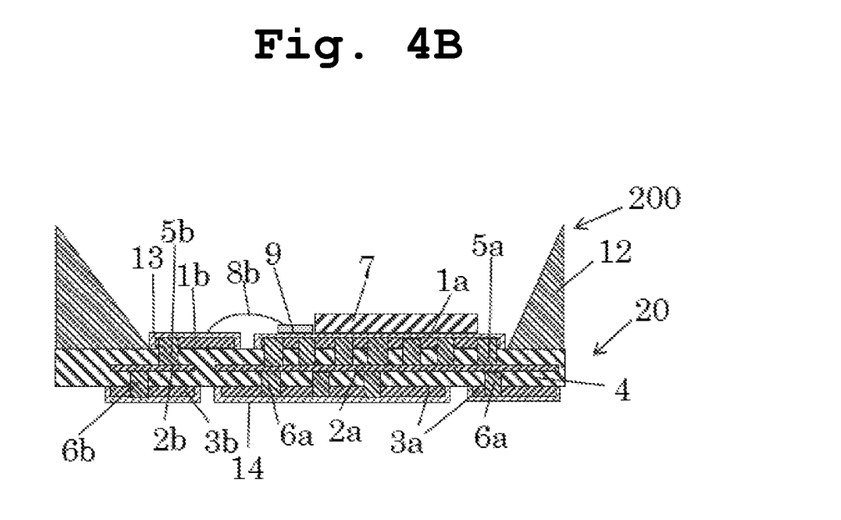
FIG. 4B shows a cross-sectional view of a light-emitting device, taken along a dotted and dashed line IVB-IVB.

FIG. 4B shows a cross-sectional view of a light-emitting device, taken along a dotted and dashed line IVB-IVB.

FIGS. 5A to 5D show how to manufacture a substrate assembly 50. A method manufacturing a substrate assembly 50 includes preparing a first electrode layer assembly L1 that includes pairs 1 of electrodes, each pair 1 of which includes a first electrode 1a and a second electrode 1b that is smaller in area than the first electrode 1a on a first side 40a of a resin layer 40. The method manufacturing the substrate assembly 50 further includes preparing a second electrode layer assembly L2 that is thinner than the first electrode layer assembly L1, the second electrode layer assembly L2 including pairs 2 of electrodes, each pair 2 of which includes a first electrode 2a and a second electrode 2b that is smaller in area than the first electrode 2a, and a first connecting portion 2a' that electrically connects first electrodes 2a of the pairs 2 of the second electrode layer assembly L2 and a second connecting portion 2b' that electrically connects second electrodes 2b of the second electrode layer assembly L2 on a second side 40b of the resin layer 40. The method manufacturing the substrate assembly 50 further includes arranging an additional resin in a state of liquid to form the resin layer 40' covering the second electrode layer assembly L2 such that the pairs 2 of the electrodes of the second electrode layer assembly L2 are buried in the resin layer 40'. The method of manufacturing the substrate assembly 50 further includes arranging a metallic layer on a second side 40b' of the resin layer 40' in which the pairs 2 of the electrodes of the second electrode layer assembly L2 is buried, the second side 40b' being an opposite side of the first side 40a of the resin layer 40' to form a third electrode layer assembly L3 of the substrate assembly 50.

The method manufacturing the substrate assembly 50 includes forming filled vias 5a, 5b to be arranged through the first electrode layer 11 in the resin layer 40' to electrically connect the first electrode layer assembly L1 and the second electrode layer assembly L2. The method manufacturing the substrate assembly 50 further includes forming filled vias 6a, 6b to be arranged through the third electrode layer 13 in the resin layer 40' to electrically connect the third electrode layer assembly L3 and the second electrode layer assembly L2.

The method manufacturing the substrate assembly 50 includes forming an electroplated coating 13 on the first electrode layer assembly L1 and the filled vias 5a, 5b that are arranged through the first electrode layer assembly L1. The electroplated coating 13 may be formed by applying current to the second electrode layer assembly L2. The method manufacturing the substrate assembly 50 further includes forming an electroplated coating 14 on the third electrode layer 13 and the filled vias 6a, 6b to be arranged through the third electrode layer 13. The electroplated coating 14 may be formed by applying current to the second electrode layer assembly L2. The electroplated coating 13 and the electroplated coating 14 may be formed on the pairs 1 of the first electrode 1a and the second electrode 1b of the first electrode layer assembly L1 and the pairs 3 of the first electrode 3a and the second electrode 3b of the second electrode layer assembly L3 simultaneously by applying current to the second electrode layer assembly L2. The pairs 2 of the first electrode 2a and the second electrode 2b in a condition as the second electrode layer assembly L2 are electrically connected by first connecting portions 2a' and second connecting portions 2b'. The first connecting portions 2a' and the second connecting portions 2b' of the second electrode layer assembly L2 are necessary to form an electroplated coating on the first electrode layer assembly L1 and the third electrode layer assembly L3.

Figure 5A:
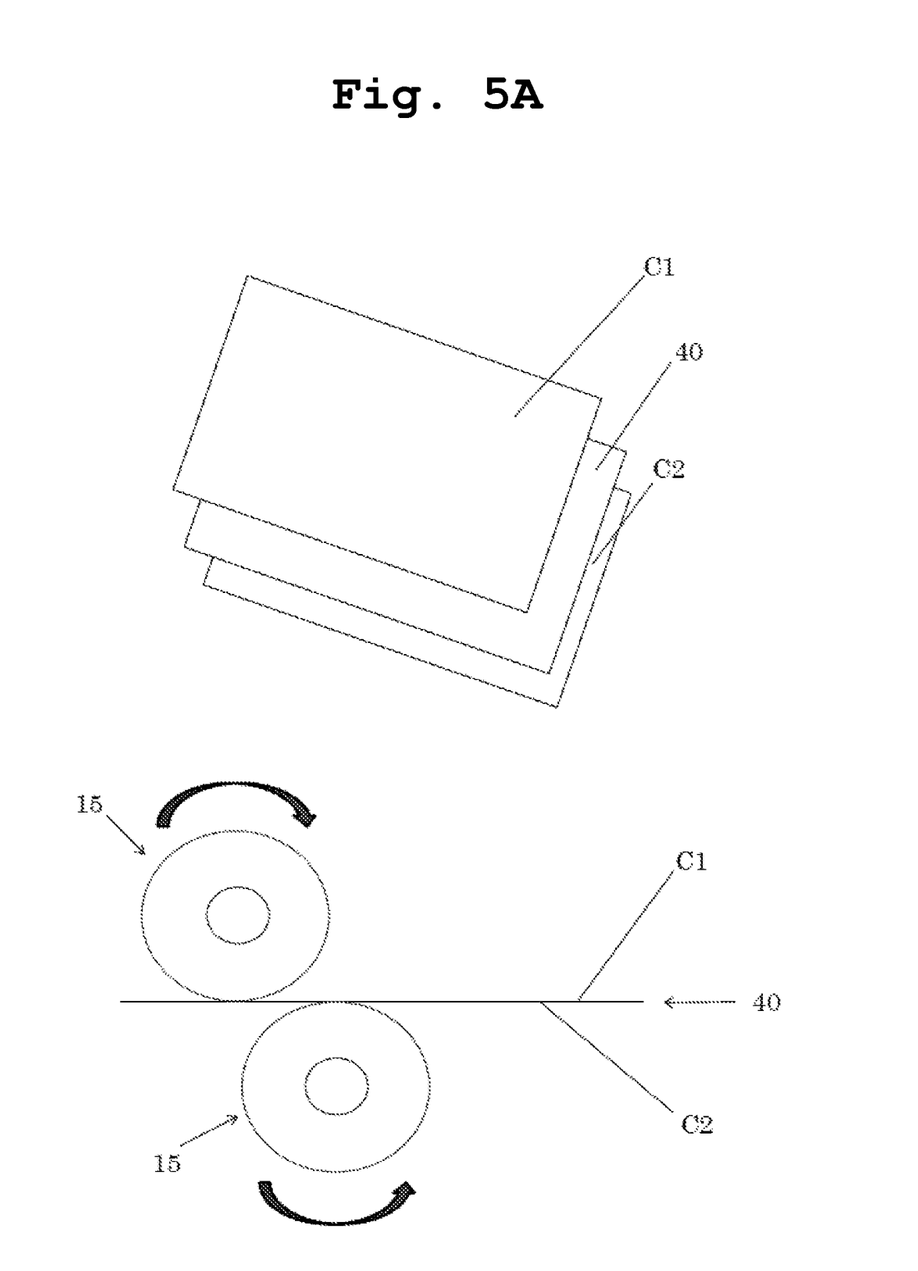
FIGS. 5A to 5D relate to a method of manufacturing a substrate assembly according to an embodiment of the subject invention.
Figure 5B:
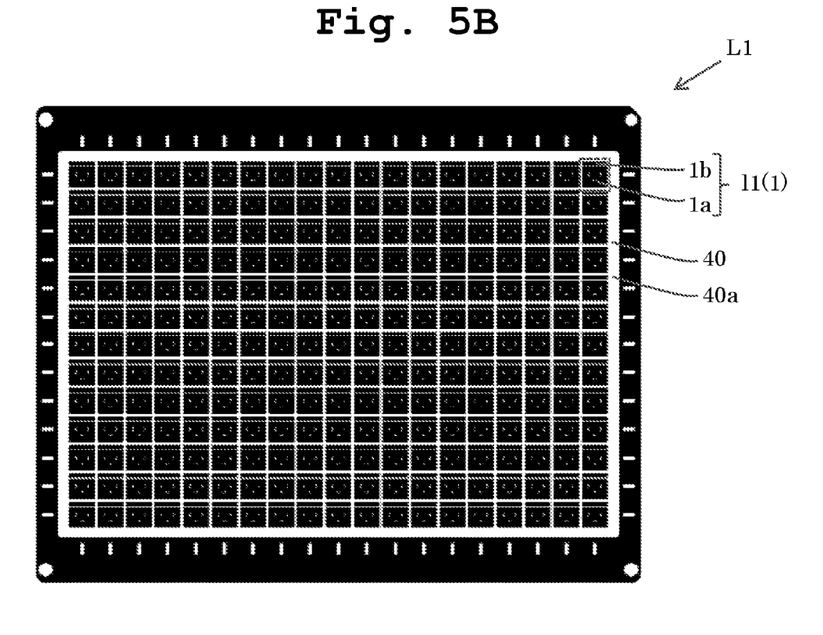
Figure 5C:
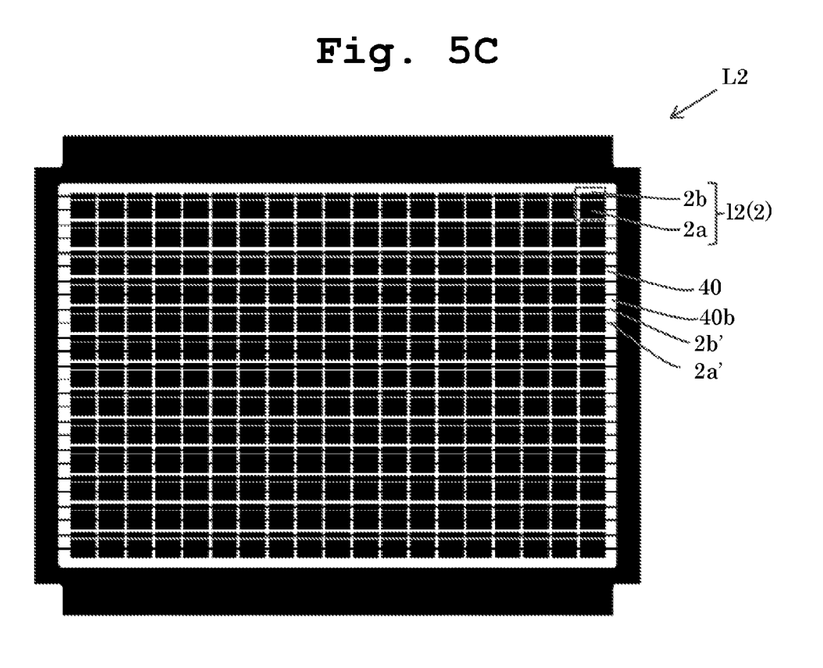
Figure 5D:
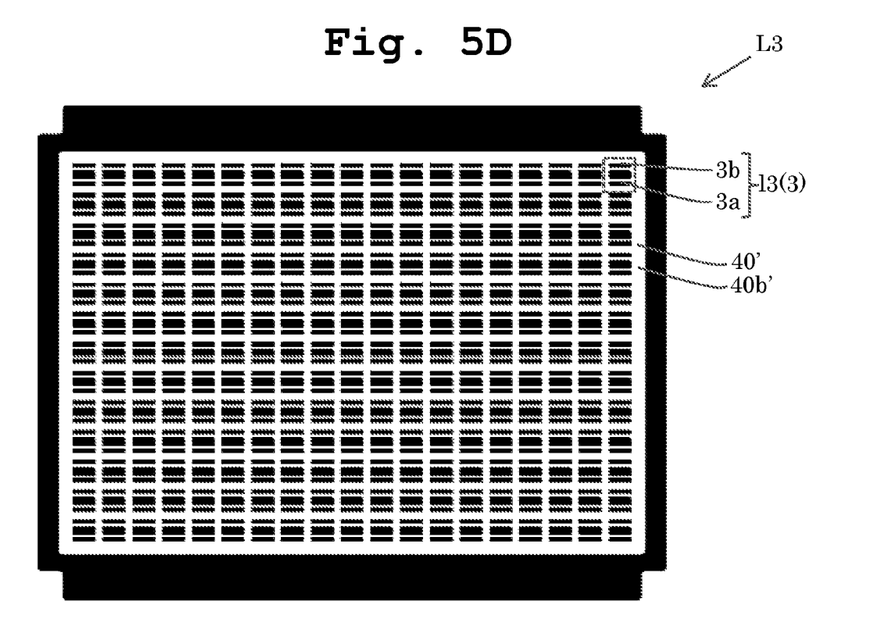

FIG. 5A shows how to make a two-sided electrode sheet assembly. A first metallic layer C1 is arranged on a first side 40a of a resin layer 40. A second metallic layer C2 is arranged on a second side 40b of the resin layer 40. The first metallic layer C1, the resin layer 40 and the second metallic layer C2 are integrated through thermal compression bonding, for example compressed by rollers 15. The second metallic layer C2 is thinner than the first metallic layer C1. Unnecessary portions of the first metallic layer C1 to be the first electrode layer assembly L1 on the first side 40a of the resin layer 40. Also, unnecessary portions of the second metallic layer C2 may be etched to be the second electrode layer assembly L2 on the second side 40b of the resin layer 40. The metallic layer C1 and the metallic layer C2 are copper foils, for example. Then, an additional resin in a state of liquid is applied over the second electrode layer assembly L2 to form the resin layer 40' covering the second electrode layer assembly L2 such that the pairs 2 of electrodes of the second electrode layer assembly L2 are buried in the resin layer 40'. Then, a third metallic layer that may be a copper foil is arranged on a second side 40b' of the resin layer 40' in which the pairs of the electrodes of the second electrode layer assembly L2 is buried. Unnecessary portions of the third metallic layer may be etched to be the third electrode layer assembly L3 on the second side 40b' that is an opposite side of the first side 40a of the resin layer 40' to form a third electrode layer assembly L3 of the substrate assembly 40.

FIGS. 5A to 5E show how to manufacture a light-emitting device including a substrate.

Figure 5E:
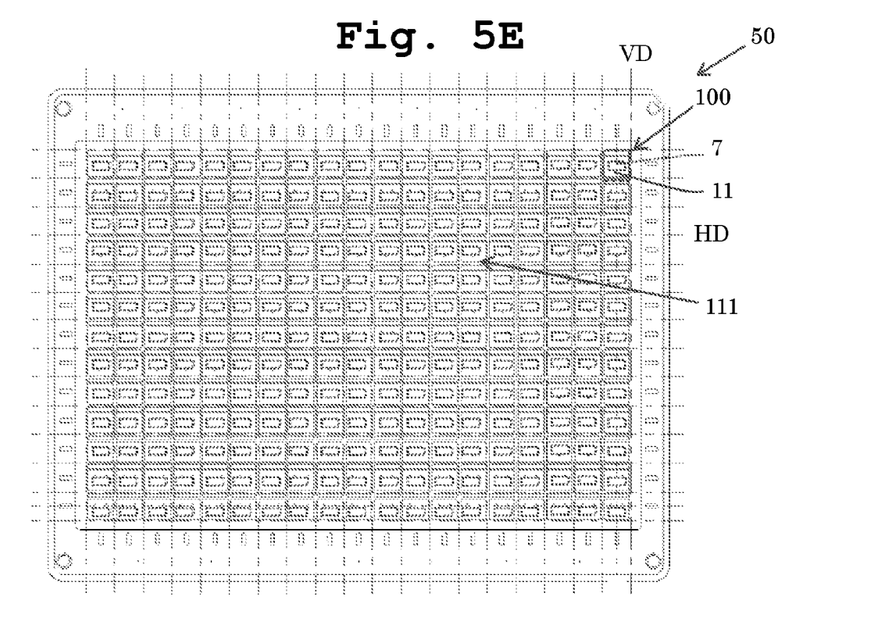

As shown in FIG. 5E, a method manufacturing a light-emitting device with a substrate includes the method manufacturing the substrate assembly 50 mentioned above and electrically mounting light-emitting elements 7 on the first electrode layer assembly L1 including the pairs 1 of the first electrode 1a and the second electrode 1b of the substrate assembly 50. The method manufacturing the light-emitting device with a substrate further includes sealing the light-emitting elements 7 by a light-transmitting resin layer 11 on the substrate assembly 50. The method manufacturing the light-emitting device with a substrate further includes dicing the substrate assembly 50 on vertical dicing lines VD and horizontal dicing lines HD with the light-emitting elements 7 mounted on the substrate assembly 50 into light-emitting devices 100 each with a substrate 10 and the first electrode 1a and the second electrode 1b of the first electrode layer 11, the first electrode 2a and the second electrode 2b of the second electrode layer 12, and the first electrode 3a and the second electrode 3b of the third electrode layer 13 and the light-transmitting layer 11.

The vertical dicing lines VD and horizontal dicing lines HD shown in FIG. 5E cross the resin layer 40' but do not cross the first electrode layer assembly L1 and the third electrode layer assembly L3. A line shape of the first connecting portions 2a' and the second connecting portions 2b' may partly cross a dicing line VD, when viewed from above, however, the first connecting portions 2a' and the second connecting portions 2b' of the second electrode layer assembly L2 are positioned in the resin layer 40' of the substrate assembly 50. Accordingly, it is possible to prevent burrs and/or broken fragments of the line portion of the first connecting portions 2a' and the second connecting portions 2b' of the second electrode layer assembly L2 from affecting the first electrode layer assembly L1 and the second electrode layer assembly L2.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

What is claimed is:

1. A substrate comprising:
a first electrode layer comprising a first electrode and a second electrode;
a second electrode layer comprising a first electrode and a second electrode;
a third electrode layer comprising a first electrode and a second electrode; and
a resin layer, wherein
the first electrode layer is arranged on a first side of the resin layer, and the third electrode layer is arranged on a second side that is an opposite side of the first side of the resin layer,
the second electrode layer is positioned in the resin layer,
the first electrode layer is greater in thickness than the second electrode layer,
the first electrode and the second electrode of the first electrode layer are positioned inside a peripheral edge of the first side of the resin layer,
the first electrode and the second electrode of the third electrode layer are positioned inside a peripheral edge of the second side of the resin layer, and
a surface area of the first electrode of the first electrode layer is at least three times as large as a surface area of the second electrode of the first electrode layer.

2. The substrate according to claim 1, wherein the third electrode layer is greater in thickness than the second electrode layer.

3. The substrate according to claim 1, wherein the first electrode layer is one and half times as thick as the second electrode layer or greater in thickness.

4. The substrate according to claim 1, wherein the third electrode layer is one and half times as thick as the second electrode layer or greater in thickness.

5. The substrate according to claim 1, wherein the first electrode of the second electrode layer in the resin layer comprises a first connecting portion that extends from the first electrode of the second electrode layer toward a peripheral side of the resin layer, and the second electrode of the second electrode layer in the resin layer comprises a second connecting portion that extends from the second electrode of the second electrode layer toward the peripheral side of the resin layer.

6. A substrate comprising:
a first electrode layer comprising a first electrode and a second electrode;
a second electrode layer comprising a first electrode and a second electrode;
a third electrode layer comprising a first electrode and a second electrode; and
a resin layer, wherein
the first electrode layer is arranged on a first side of the resin layer, and the third electrode layer is arranged on a second side that is an opposite side of the first side of the resin layer,
the second electrode layer is positioned in the resin layer,
the first electrode layer is greater in thickness than the second electrode layer,
the first electrode and the second electrode of the first electrode layer are positioned inside a peripheral edge of the first side of the resin layer,
the first electrode and the second electrode of the third electrode layer are positioned inside a peripheral edge of the second side of the resin layer,
the first electrode of the first electrode layer, the first electrode of the second electrode layer, and the first electrode of the third electrode layer are electrically connected to one another through filled vias, and
a number of the filled vias that electrically connect the first electrode of the first electrode layer and the first electrode of the second electrode layer is greater than a number of filled vias that electrically connect the second electrode of the first electrode layer and the second electrode of the second electrode layer.

7. The substrate according to claim 6, wherein the second electrode of the first electrode layer, the second electrode of the second electrode layer, and the second electrode of the third electrode layer are electrically connected to one another through filled vias.

8. A substrate comprising:
a first electrode layer comprising a first electrode and a second electrode;
a second electrode layer comprising a first electrode and a second electrode;
a third electrode layer comprising a first electrode and a second electrode;
a resin layer; and
an electroplated coating, wherein
the first electrode layer is arranged on a first side of the resin layer, and the third electrode layer is arranged on a second side that is an opposite side of the first side of the resin layer,
the second electrode layer is positioned in the resin layer,
the first electrode layer is greater in thickness than the second electrode layer,
the first electrode and the second electrode of the first electrode layer are positioned inside a peripheral edge of the first side of the resin layer,
the first electrode and the second electrode of the third electrode layer are positioned inside a peripheral edge of the second side of the resin layer, and
the electroplated coating separately covers the first electrode and the second electrode of the first electrode layer.

9. The substrate according to claim 8, further comprising:
an electroplated coating separately covering the first electrode and the second electrode of the third electrode layer.

10. A substrate comprising:
a first electrode layer comprising a first electrode and a second electrode;
a second electrode layer comprising a first electrode and a second electrode;
a third electrode layer comprising a first electrode and a second electrode;
a resin layer;
a first electroplated coating; and
a second electroplated coating, wherein
the first electrode layer is arranged on a first side of the resin layer, and the third electrode layer is arranged on a second side that is an opposite side of the first side of the resin layer,
the second electrode layer is positioned in the resin layer,
the first electrode layer is greater in thickness than the second electrode layer,
the first electrode and the second electrode of the first electrode layer are positioned inside a peripheral edge of the first side of the resin layer,
the first electrode and the second electrode of the third electrode layer are positioned inside a peripheral edge of the second side of the resin layer,
the first electroplated coating is positioned at the first side of the resin layer and covers the first electrode of the first electrode layer and filled vias that are configured to electrically connect the first electrode of the first electrode layer and the first electrode of the second electrode layer, and
the second electroplated coating is positioned at the first side of the resin layer and covers the second electrode of the first electrode layer and filled vias that are configured to electrically connect the second electrode of the first electrode layer and the second electrode of the second electrode layer.

11. The substrate according to claim 10, further comprising:
an electroplated coating being positioned at the second side of the resin layer and covering the first electrode of the third electrode layer and filled vias that are configured to electrically connect the first electrode of the third electrode layer and the first electrode of the second electrode layer; and
an electroplated coating being positioned at the second side of the resin layer and covering the second electrode of the third electrode layer and filled vias that are configured to electrically connect the second electrode of the third electrode layer and the second electrode of the second electrode layer.

12. A light-emitting device comprising:
a light-emitting element; and
a substrate comprising:
a first electrode layer comprising a first electrode and a second electrode;
a second electrode layer comprising a first electrode and a second electrode;
a third electrode layer comprising a first electrode and a second electrode;
a resin layer; and
an electroplated coating covering the first electrode of the first electrode layer, wherein
the first electrode layer is arranged on a first side of the resin layer, and the third electrode layer is arranged on a second side that is an opposite side of the first side of the resin layer,
the second electrode layer is positioned in the resin layer,
the first electrode layer is greater in thickness than the second electrode layer,
the first electrode and the second electrode of the first electrode layer are positioned inside a peripheral edge of the first side of the resin layer, and
the first electrode and the second electrode of the third electrode layer are positioned inside a peripheral edge of the second side of the resin layer,
wherein the light-emitting element is arranged on the electroplated coating of the first electrode of the first electrode layer.

13. The light-emitting device according to claim 12, wherein
the light-emitting element has a peak wavelength in a range of 800 nm to 1000 nm.

14. A light-emitting device comprising:
a substrate; and
a light-emitting element mounted on the substrate, wherein
the substrate comprises a first electrode layer comprising a first electrode and a second electrode, a second electrode layer comprising a first electrode and a second electrode, a third electrode layer comprising a first electrode and a second electrode, and a resin layer,
the first electrode layer is arranged on a first side of the resin layer, and the third electrode layer is arranged on a second side that is an opposite side of the first side of the resin layer,
the second electrode layer is positioned in the resin layer,
the first electrode layer is greater in thickness than the second electrode layer,
the light-emitting element is mounted on the first electrode of the first electrode layer, and the light-emitting element is electrically connected to the first electrode and the second electrode of the first electrode layer,
the first electrode and the second electrode of the first electrode layer are positioned inside a peripheral edge of the first side of the resin layer,
the first electrode and the second electrode of the third electrode layer are positioned inside a peripheral edge of the second side of the resin layer,
the first electrode of the second electrode layer in the resin layer comprises a first connecting portion that extends from the first electrode of the second electrode layer toward a peripheral side of the resin layer, and the second electrode of the second electrode layer in the resin layer comprises a second connecting portion that extends from the second electrode of the second electrode layer toward the peripheral side of the resin layer,
the first electrode of the first electrode layer, the first electrode of the second electrode layer, and the first electrode of the third electrode layer are electrically connected to one another through filled vias, and
the second electrode of the first electrode layer, the second electrode of the second electrode layer, and the second electrode of the third electrode layer are electrically connected to one another through filled vias.

15. A method of manufacturing a substrate assembly comprising:
preparing a first electrode layer assembly that comprises pairs of electrodes, each pair of which comprises a first electrode and a second electrode that is smaller in area than the first electrode on a first side of a resin layer;
preparing a second electrode layer assembly that is thinner than the first electrode layer assembly, the second electrode layer assembly comprises pairs of electrodes, each pair of which comprises a first electrode and a second electrode that is smaller in area than the first electrode and a first connecting portion that electrically connects first electrodes of the pairs of the second electrode layer assembly and a second connecting portion that electrically connects second electrodes of the second electrode layer assembly on a second side of the resin layer;

arranging an additional resin in a state of liquid to form the resin layer covering the second electrode layer assembly such that the pairs of the electrodes of the second electrode layer assembly are buried in the resin layer; and arranging a metallic layer on a second side of the resin layer in which the pairs of the electrodes of the second electrode layer assembly is buried, the second side being an opposite side of the first side of the resin layer to form a third electrode layer assembly of the substrate assembly;

forming filled vias to be arranged through the first electrode layer assembly in the resin layer to electrically connect the first electrode layer assembly and the second electrode layer assembly;

forming filled vias to be arranged through the third electrode layer assembly in the resin layer to electrically connect the third electrode layer assembly and the second electrode layer assembly;

forming an electroplated coating on the first electrode layer assembly and the filled vias that are arranged through the first electrode assembly layer; and forming an electroplated coating on the third electrode layer assembly and the filled vias that are arranged through the third electrode assembly layer.

16. A method of manufacturing a light-emitting device with a substrate comprising:

the method manufacturing the substrate assembly of claim 15;

electrically mounting light-emitting elements on the first electrode layer assembly comprising the pairs of the first electrode and the second electrode of the substrate assembly;

sealing the light-emitting elements by a light-transmitting resin layer on the substrate assembly; and dicing the substrate assembly with the light-emitting elements mounted and sealed by the light-transmitting resin layer on the substrate assembly into light-emitting devices each with a substrate that includes the first electrode and the second electrode of the first electrode layer, the first electrode and the second electrode of the second electrode layer, and the first electrode and the second electrode of the third electrode layer and the light-transmitting resin layer.

17. The method of manufacturing a substrate assembly according to claim 15, wherein the electroplated coating is formed on the first electrode layer assembly and the filled vias that electrically connect the first electrode layer assembly and the second electrode layer assembly by applying current to the second electrode layer assembly, and the electroplated coating is formed on the third electrode layer assembly and the filled vias that electrically connect the third electrode layer assembly and the second electrode layer assembly by applying current to the second electrode layer assembly.

* * * * *

UNITED STATES PATENT AND TRADEMARK OFFICE
CERTIFICATE OF CORRECTION

PATENT NO. : 9,852,974 B2
APPLICATION NO. : 15/198637
DATED : December 26, 2017
INVENTOR(S) : Yuichi Miura It is certified that error appears in the above-identified patent and that said Letters Patent is hereby corrected as shown below:

On the Title Page

In Item (73) Assignees, Lines 2-3, please correct "CITIZENS WATCH CO., LTD." to -- CITIZEN WATCH CO., LTD. --.

Signed and Sealed this
Fifth Day of June, 2018

Andrei Iancu
*Director of the United States Patent and Trademark Office*